United States Patent
Wakiyama et al.

(10) Patent No.: US 7,378,654 B2
(45) Date of Patent: May 27, 2008

(54) PROCESSING PROBE

(75) Inventors: Shigeru Wakiyama, Chiba (JP); Osamu Takaoka, Chiba (JP); Masatoshi Yasutake, Chiba (JP)

(73) Assignee: SII NanoTechnology Inc. (JP)

( * ) Notice: Subject to any disclaimer, the term of this patent is extended or adjusted under 35 U.S.C. 154(b) by 0 days.

(21) Appl. No.: 11/066,063

(22) Filed: Feb. 25, 2005

(65) Prior Publication Data

US 2005/0199809 A1    Sep. 15, 2005

(30) Foreign Application Priority Data

Mar. 15, 2004    (JP)    ............... 2004-072658

(51) Int. Cl.
    *G01N 23/00*    (2006.01)
(52) U.S. Cl. ...................... 250/306; 977/855
(58) Field of Classification Search ............... 977/855; 250/306
See application file for complete search history.

(56) References Cited

U.S. PATENT DOCUMENTS 6,197,455 B1 *   3/2001   Yedur et al. .................. 430/5
6,328,902 B1 *   12/2001   Hantschel et al. ............. 216/2
6,884,999 B1 *   4/2005   Yedur et al. ................ 250/306

OTHER PUBLICATIONS

"Optimization of Nanomachining Repair Conditions for ArF lithography", Tsuyoshi Amano et al., Proceedings of SPIE, vol. 5256, pp. 538-545.

"Scanning Type of Probe Microscope, Foundation and Future Forecast", Seizo Morita, Maruzen, published Feb. 10, 2000, pp. 21-24.

"Development of Atomic Force Microscope Integrated Type of Processing Evaluation Apparatus—Development of AFM Cantilever for Processing", Kiwamu Ashida et al., Journal of the Japan Society for Abrasive Technology, vol. 41, No. 7, pp. 276-281, Jul. 1997.

* cited by examiner

*Primary Examiner*—David Vanore
(74) *Attorney, Agent, or Firm*—Adams & Wilks

(57) ABSTRACT

A processing probe for repairing a defective portion in a sample has a cantilever and a probe separate and independent from the cantilever and integrally connected to an end portion of the cantilever for scratch-processing a defective portion of a sample. The cantilever and the probe are conductive for preventing the generation of electrostatic charges by friction of the probe against the sample during scratch-processing of the defective portion of the sample.

17 Claims, 5 Drawing Sheets

PROCESSING PROBE

BACKGROUND OF THE INVENTION

1. Field of the Invention

The present invention relates to a processing probe for performing a minute process using a probe microscope technique and, more particularly, to a processing probe used in a method of removing a defective portion by mechanical scratching during repair of a photo-mask defect.

2. Background Art

As is generally known, when a photo-mask causes a defect of a transferred pattern, repair is required after inspection since the photo-mask is used as an original. There are two kinds of repair methods: black defect (convex defect) repair method in which a redundant shielding film is removed; and white defect repair method in which a shielding film is formed at a portion lacking pattern. In the white defect repair method, a general method is to spray organic gas on a surface of the mask while a gallium ion is radiated to deposit a carbon film (FIB deposition: Focused Ion Beam System). On the other hand, as the black defect repair method, there is known a laser repair method in which a laser beam is radiated on a defective portion to vaporize a remaining portion of the shielding film in an instant, and an FIB gas assist etching method in which a gallium ion is radiated to carry out sputtering. In the laser repair method, the processing shape, reduction of damage to glass substrate and reduction of rise of an edge are improved while improvement in optical resolution and precision of image processing and a sample stage are achieved so as to be able to correspond to a minute pattern. It is difficult, however, to completely correspond to a further minute pattern due to an optical limit, so that the FIB repair method is the mainstream of the minute pattern repair. In the FIB repair method a superior height controlling characteristic is required due to a shortening of an exposure wavelength, and over-etching and re-adherence deteriorate an optical characteristic. Further, there is also a problem that end point detection is incorrectly performed in the case of using a halftone mask or a Levenson mask.

In view of the above, there is a scratching process, which is superior in height controlling characteristic in the black defect removing and has an advantage that the end point detection goes well even in the case of using a halftone mask or a Levenson mask. In the scratching process, a probe harder than a material to be processed is used for physical removal. As the scratching process, there has been proposed a minute processing method in which a probe is used with the probe microscope technique (refer to Non-Patent Reference 1, for example). It has been known that the probe microscope is an apparatus in which physical force such as atomic force operated between a sample and a minute probe produced with a micro-machine technique is detected as change in shape or displacement of the minute probe so that a shape and a physical characteristic of a surface of the sample would be converted into an image to observe and measure the image (refer to Non-Patent Reference 2, for example).

Non-Patent Reference 1 discloses a mechanical scratch of a defective portion of a photo-mask by means of a probe with the above-mentioned technique used for the probe microscope (the probe microscope technique).

FIG. 5 shows an example of repairing a photo-mask defect by means of a probe. FIG. 5a is a simplified perspective view of a defective potion of a photo-mask, which is a target of the probe process. FIG. 5b illustrates the defective portion shown in FIG. 5a, which is under processing by means of a probe.

In FIG. 5a, 20 denotes a glass substrate of a photo-mask. A mask pattern film 21 (a chrome film, for example) formed on the glass substrate of a photo-mask 20 has a redundant convex defect 22. A defect target for repairing by probe processing is thus a black defect shown by the numeral 22. The defect 22 is removed by moving a probe 24 formed on a top end of a member usually called a cantilever 23, which is formed in the shape of a strip as shown in FIG. 5b, as shown by an arrow 25.

A probe used in the probe microscope technique is mainly formed by anisotropically etching silicon. Accordingly, a probe used in a method of minute processing by means of a probe is usually formed from silicon, and thereby, is an insulating material. Further, there has also been a probe provided such that a cantilever member formed in the shape of a strip is formed with the micro-machining technique or from a metal thin film and diamond or the like is adhered thereto so as to produce a probe (refer to Non-Patent Reference 3, for example) Such a probe is also made from an insulating material. In the case that a material of the probe is insulative, a mask pattern is likely to be damaged because of electric discharge between the mask patterns caused by static electricity due to friction in a method of removing the defective portion by scratching with a probe since a material of the photo-mask is glass.

[Non-Patent Reference 1] Proceedings of SPIE Vol. 5256 [Photo-mask repair performance of the SiON/Ta—Hf attenuating PSM] Masaharu Nishiguchi, Tauyoshi Amano, Shiho Sasaki, Yasutake Morikawa, and Naoya Hayashi (FIG. 2, Bottom in Page 1201, Lines 1 to 7 in Page 1202)

[Non-Patent Reference 2] [Scanning Type of Probe Microscope, Foundation And Future Forecast] Edited and written by Seizo Morita, Maruzen, Feb. 10, 2000 (Line 7 in Page 21 to Line 12 in Page 24)

[Non-Patent Reference 3] Journal of the Japan Society for Abrasive Technology [Development of Atomic Force Microscope Integrated Type of Processing Evaluation Apparatus—Development of AFM Cantilever for Processing] Vo. 41, No. 7, July 1997. 276-281 (Line 17 in Left Column in Page 277 to Line 19 in Left Column in Page 279) Kiwamu Ashida, Noboru Morita, Kitaro Yoshida, Seiji Hirai

SUMMARY OF THE INVENTION

In view of the above-mentioned problems, an object of the invention is to provide a processing probe capable of repairing a mask-pattern without any damage by preventing electric discharge between the mask patterns, which is caused by electrostatic electrification due to friction between a probe and a mask glass substrate, in repairing a black defect (a convex defect) of a photo-mask with the probe microscope technique.

For the purpose of solving the above-mentioned problems, the invention is a processing probe in an apparatus for repairing a photo-mask defective portion by a mechanical operation such as cutting or the like by means of a probe with the probe microscope technique, wherein a probe portion for scratching the defective portion has conductivity.

Further, the invention is a processing probe wherein a conductive element is injected into a cantilever portion formed by silicon anisotropic etching and the probe portion so that the processing probe would have conductivity.

Moreover, the invention is a processing probe wherein a metal coating is provided on a cantilever portion formed by silicon anisotropic etching and the probe portion so that the processing probe would have conductivity.

In addition to the above, the invention is a processing probe wherein a cantilever portion formed by silicon anisotropic etching is coated with a conductive film before fixedly adhering a conductive probe portion thereto so that the processing probe would have conductivity.

The invention is also a processing probe wherein a conductive probe portion is fixedly adhered to a cantilever portion formed by a metal thin film so that the processing probe would have conductivity.

Further, the invention is a processing probe wherein a cantilever portion formed by silicon anisotropic etching and the probe portion are coated with a conductive film, and then, the conductive probe is formed on a top end of the probe with an FIB (Focused Ion Beam System) deposition technique.

Moreover, the invention is a processing probe wherein the probe formed with the FIB deposition technique is in the shape of a cylinder.

Additionally, the invention is a processing probe wherein the probe portion formed with the FIB deposition technique is in the shape of a square pillar.

Using a conductive cantilever portion and a conductive probe allows static electricity to be released from the conductive probe, the conductive cantilever and the cantilever holding member to a square body of the apparatus in moving the probe without causing electrostatic electrification due to friction between a glass of a photo-mask substrate and a probe contacting portion. Accordingly, electric discharge between mask patterns due to electrostatic electrification can be prevented, and thereby, the mask pattern is not damaged at all. There is an effect of enabling defect repair of a mask corresponding to a fine pattern portion by the probe cutting with the probe microscope technique.

DESCRIPTION OF THE PREFERRED EMBODIMENTS

A conductive element is injected into a cantilever portion formed by silicon anisotropic etching and a probe portion so that the processing probe would have conductivity. Further, a metal coating may be provided on a cantilever portion formed by silicon anisotropic etching and a probe portion so that the processing probe would have conductivity. It may be also possible to coat a cantilever portion formed by silicon anisotropic etching with a conductive film before fixedly adhering a conductive probe portion thereto so that the processing probe would have conductivity. Moreover, a conductive probe portion may be fixedly adhered to a cantilever portion formed by a metal thin film so that the processing probe would have conductivity. Furthermore, it may be possible to coat a cantilever portion formed by silicon anisotropic etching and a probe portion with a conductive film, and then, form a conductive probe on a top end of the prove portion with an FIB deposition technique. Embodiments of a processing probe in accordance with the invention will be described in detail hereinafter, made reference to the drawings.

Embodiment 1

FIG. 1 illustrates a conductive processing probe in a first embodiment of the invention. FIGS. 1a to 1d show a manufacturing process of the processing probe. First, a cantilever portion 1 and a base portion or basement 2 are formed by anisotropic etching of a silicon water (FIG. 1a). Then, provided is a conductive coating. A rhodium coating 3 has been provided by means of a sputtering apparatus in the embodiment (FIG. 1b). After carrying out sputter cleaning on a surface of a piece of diamond, a boron ion is injected, and then, a probe 4 to which a conductive element is injected and which is formed from a diamond is fixed to the cantilever portion 1 by means of a conductive adhesive (FIG. 1c). A processing probe consisting of a conductive diamond probe is thus produced (FIG. 1d). Using the processing probe for mask repair results in confirmation that processing safer than the case of using a conventional processing probe with no conductivity can be achieved.

Embodiment 2

Figure 1A:
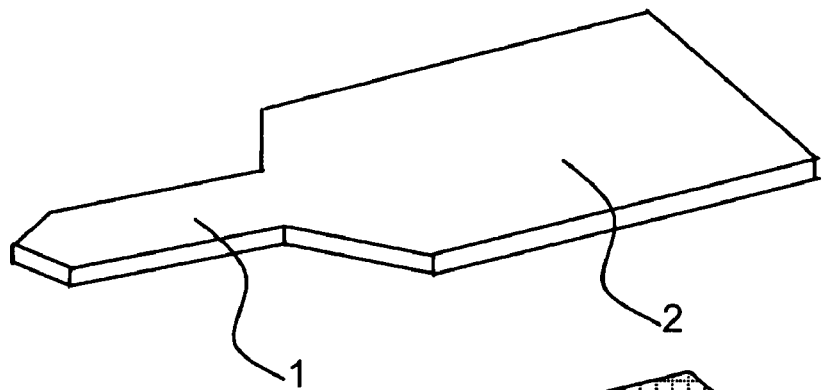
FIG. 1 is a perspective view of a processing probe in a first embodiment of the invention.
Figure 1B:
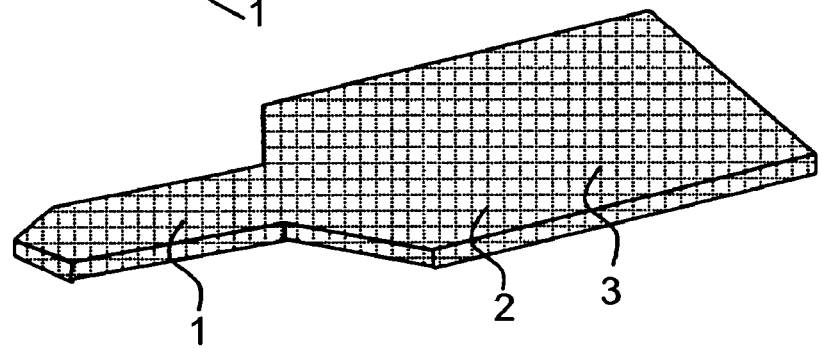
Figure 1C:
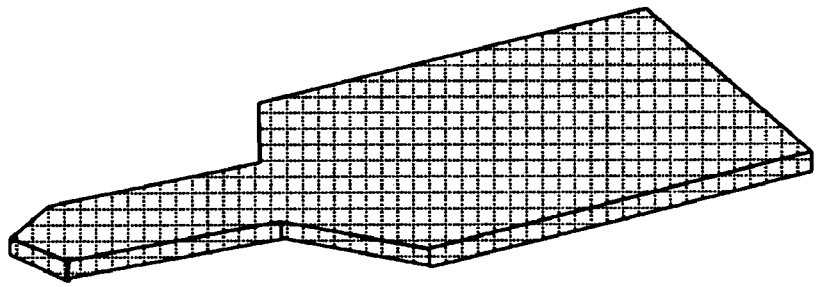
Figure 1D:
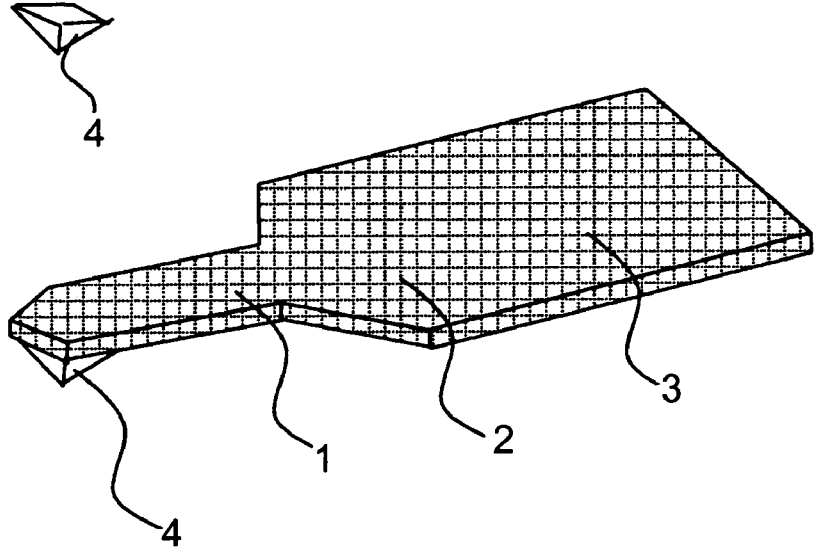
Figure 2A:
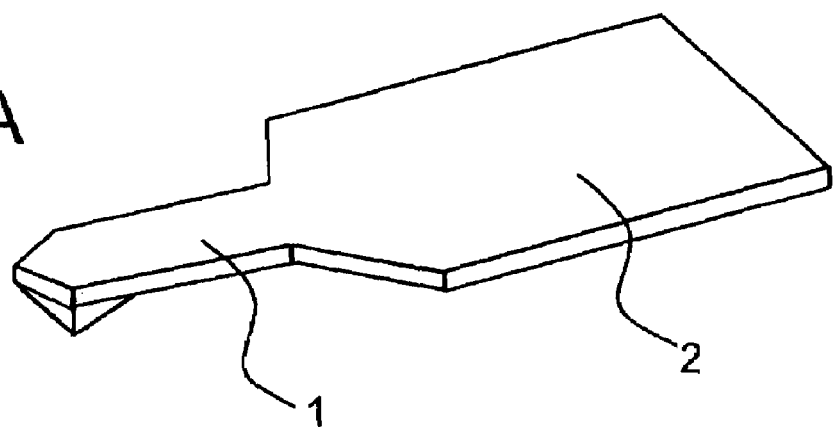
FIG. 2 is a perspective view of a processing probe in a second embodiment of the invention.
Figure 2B:
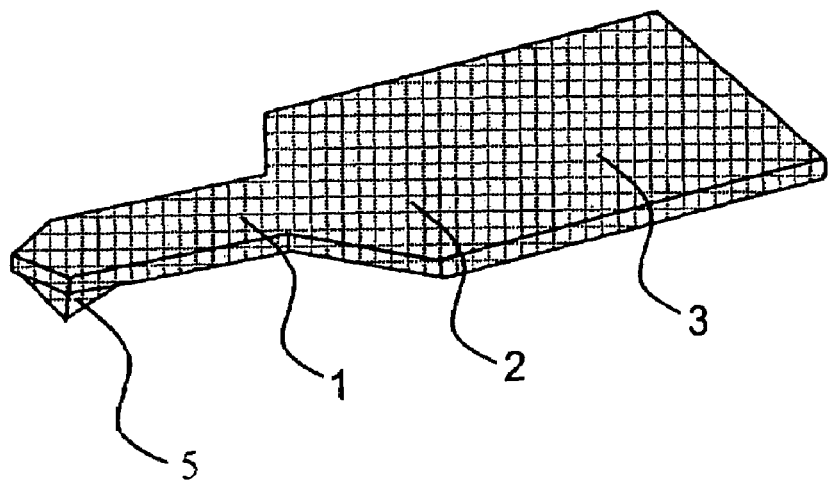

FIG. 2 illustrates a conductive processing probe in a second embodiment of the invention. FIGS. 2a and 2b show a manufacturing process of the processing probe.

First, a cantilever portion 1, a base portion or basement 2 and a probe 5 are formed by silicon anisotropic etching of a silicon water (FIG. 2a). Then, carried out is conductive processing. A rhodium coat 3 has been provided in the conductive process in Embodiment 2 (FIG. 2b). A processing probe in Embodiment 2 is likely to deteriorate in endurance as compared with the processing probe in Embodiment 1 since a material of the probe 5 is silicon. In can be considered, however, to be more suitable for mass production much than the processing probe in Embodiment 1 from a point of view that a manufacturing process of the cantilever and the probe and process of giving conductivity thereto can be carried out in a state of processing the silicon wafer.

Embodiment 3

FIG. 3 illustrates a conductive processing probe in a third embodiment of the invention. FIGS. 3a to 3d show a manufacturing process of the processing probe.

Figure 3A:
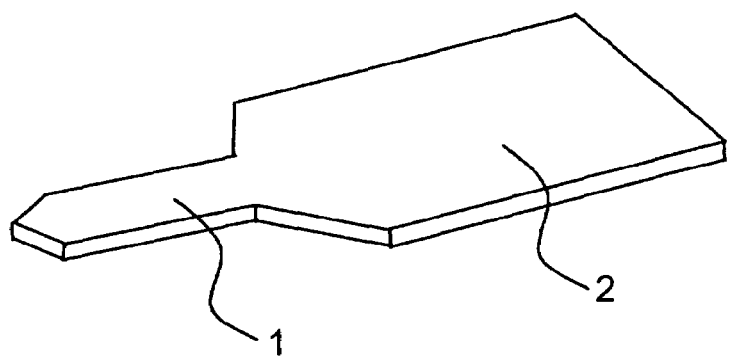
FIG. 3 is a perspective view of a processing probe in a third embodiment of the invention.
Figure 3B:
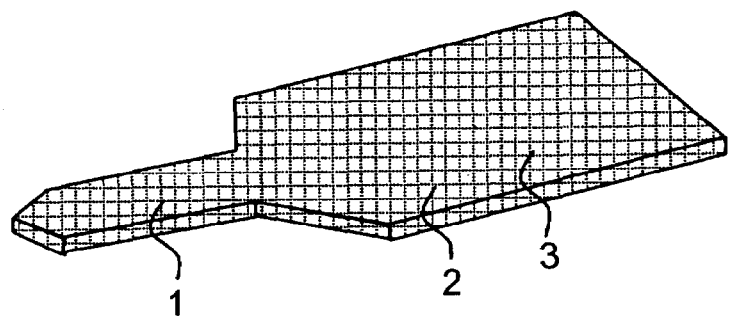
Figure 3C:
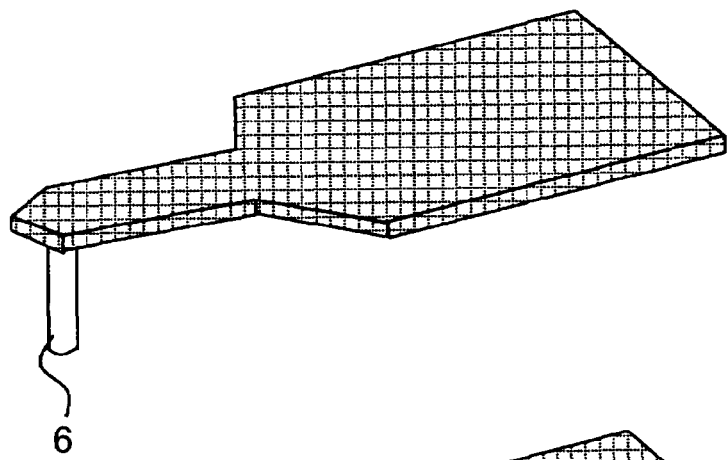
Figure 3D:
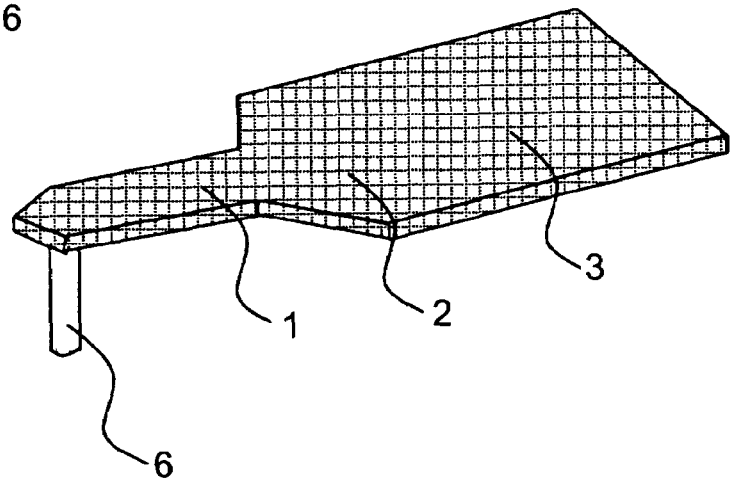

First, a cantilever portion 1 and a base portion or basement 2 are formed by anisotropic ally etching silicon, similarly to Embodiment 1 (FIG. 3a). Next, provided is a conductive coating 3 (FIG. 3b). A cylindrical probe 6 formed from a conductive carbon is then formed on a top end of the cantilever portion 1 using the FIB deposition technique (FIGS. 3c and 3d). In the case of the probe 6, it is possible to make a ratio of a length to a diameter of the probe, that is, an aspect ratio, large (the length is longer than the diameter), so that the probe is suitable for processing of a portion, which is deep with respect to a width of a groove. The probe 6 is the shape of a cylinder in Embodiment 3, but the probe portion may be processed into the shape of a square pillar using the FIB etching technique. This allows a corner or an edge of a mask to be repaired well.

Embodiment 4

Figure 4:
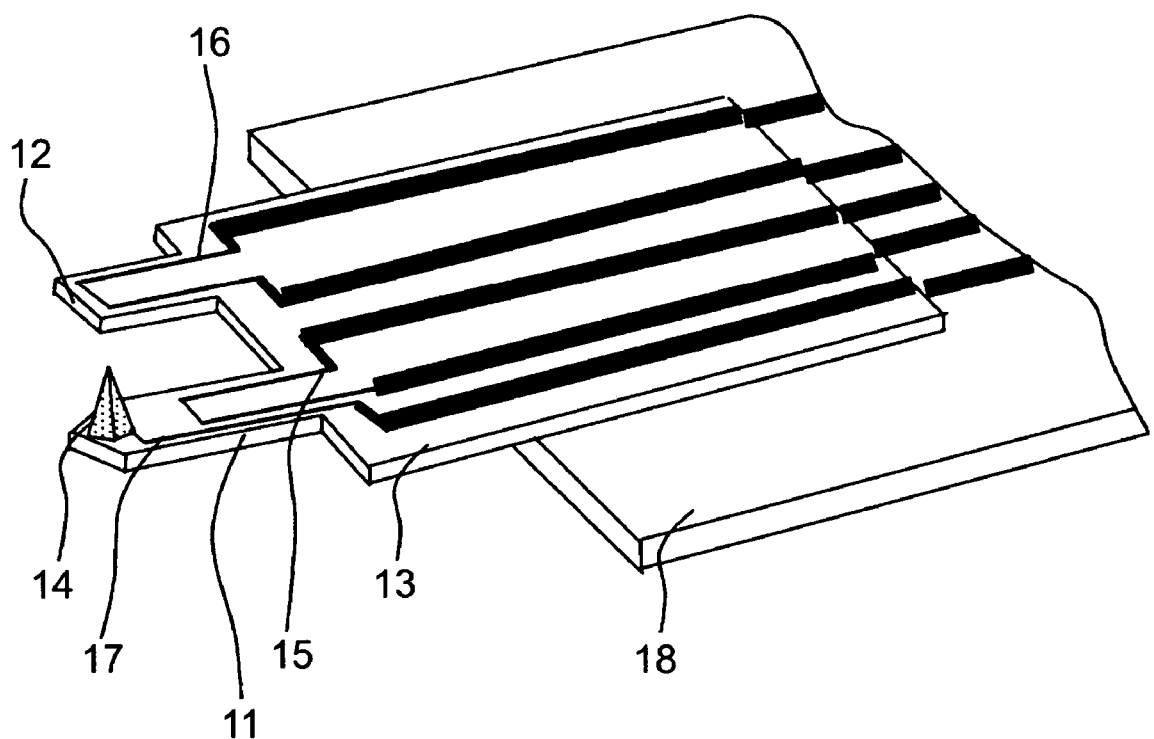
FIG. 4 is a perspective view of a processing probe in a fourth embodiment of the invention.

FIG. 4 illustrates a conductive processing probe in a fourth embodiment of the invention. In Embodiments 1 to 3 mentioned above, described is a cantilever of the type that deformation of the cantilever is detected by means of an optical lever mechanism. In Embodiment 4, there is a self-detection type cantilever in which deformation of the cantilever is detected as a change in resistance value.

In a general structure of a self-detection type cantilever, a cantilever 11 and a reference cantilever 12 are manufactured via a base portion or basement 13 by anisotropic etching to form a conductive probe 14 on a top end of the cantilever. The probe 14 may be formed by anisotropic etching in manufacturing a cantilever so as to have conductivity. Further, the probe 14 may be formed by adhering a conductive probe later or by FIB deposition. The self-detection type cantilever is formed with wiring 15 and 16 for measuring a so-called change is distortion resistance in which the deformation of the cantilever corresponds to a change in resistance. Moreover, wiring 17 connected to the conductive probe is also provided in Embodiment 4 so as to be fixedly adhered to a substrate 18 through the basement 13. In the self-detection type of cantilever, optical axis alignment of a laser beam is not required differently from the case of the optical lever mechanism, so that a probe can be easily replaced. Accordingly, an operation for replacement becomes easy to perform from the viewpoint of a structure of the apparatus in the case of preparing plural shapes of processing probe so as to correspond to the shape of defects. This cause improvement in throughout.

Figure 5A:
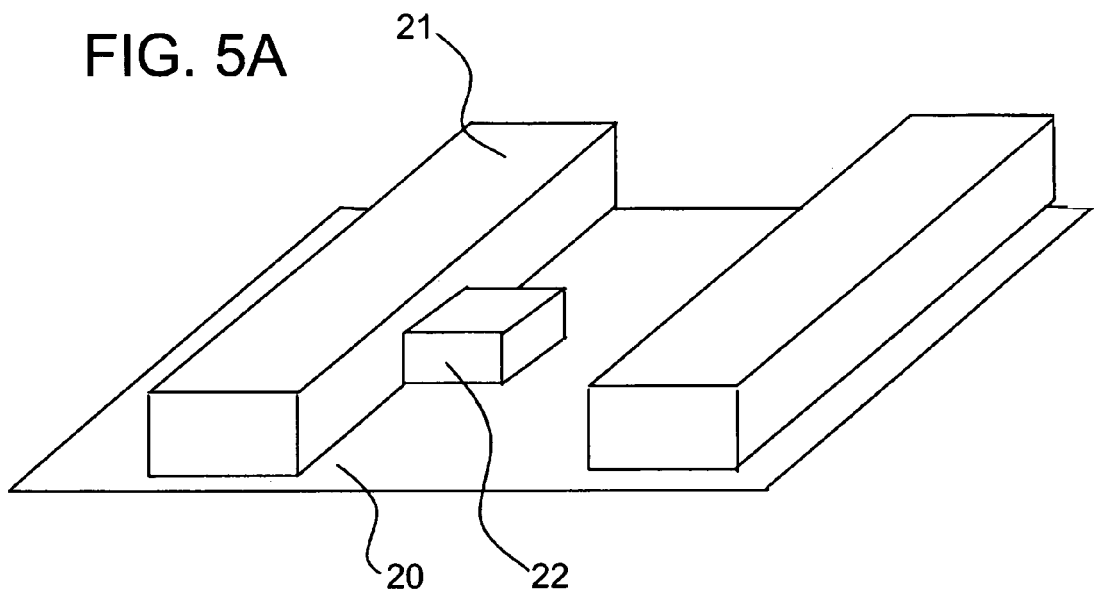
FIG. 5 is a perspective view for illustrating repair of a mask defect by means of a probe.
Figure 5B:
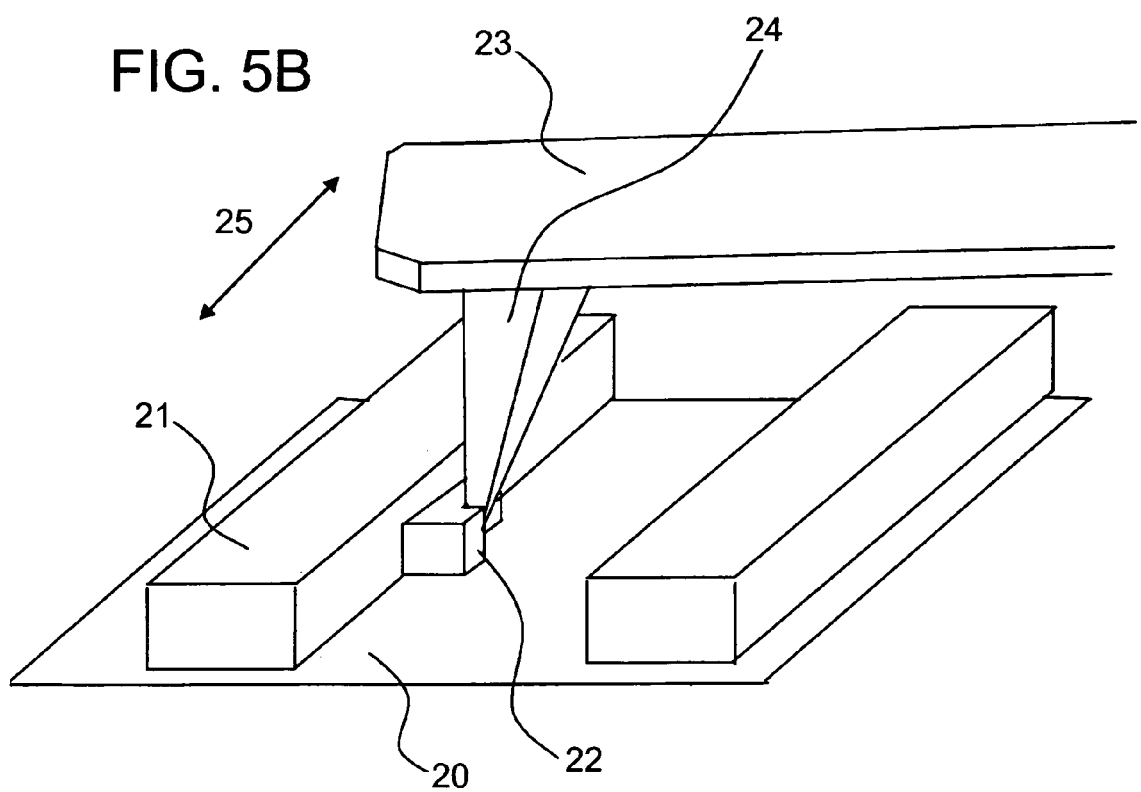

The processing repair of a photo-mask defective portion by means of a conductive processing probe in Embodiments 1 to 4 mentioned above is carried out in a similar method to a method shown in FIG. 5, as also described in Background Art. In the processing repair by means of a conductive processing probe in accordance with the invention, however, electrostatic electrification due to friction between a probe and a mask glass substrate is not caused since the probe has conductivity, so that electric discharge between mask patterns can be prevented. This allows the mask pattern to be safely repaired without any damage.

What is claimed is:

1. A processing probe for repairing a defective portion in a photo-mask, the processing probe comprising: a conductive cantilever; and a conductive probe for scratch-processing a defective portion of a photo-mask, the conductive probe being separate and independent from the conductive cantilever and being integrally connected to an end portion of the conductive cantilever for undergoing deformation due to a physical force generated between the photo-mask and the conductive probe during processing of the defective portion.

2. A processing probe according to claim 1; wherein the cantilever comprises an anisotropically-etched silicon cantilever; and further comprising a conductive element injected into the cantilever and the probe for making the cantilever and the probe conductive.

3. A processing probe according to claim 1; wherein the cantilever comprises an anisotropically-etched silicon cantilever; and further comprising a metal coating disposed on the cantilever and the probe for making the cantilever and the probe conductive.

4. A processing probe according to claim 1; wherein the cantilever comprises an anisotropically-etched silicon cantilever coated with a conductive film for making the cantilever conductive.

5. A processing probe according to claim 1; wherein the cantilever is coated with a thin metal film for making the cantilever conductive.

6. A processing probe according to claim 1; wherein the cantilever comprises an anisotropically-etched silicon cantilever and the conductive probe is formed on the end of the silicon cantilever by a focused ion beam deposition technique; and further comprising a conductive film coated on the silicon cantilever and the conductive probe.

7. A processing probe according to claim 6; wherein the conductive probe is in the shape of a cylinder.

8. A processing probe according to claim 6; wherein the conductive probe is in the shape of a square pillar.

9. A processing probe for repairing a defective portion in a sample, the processing probe comprising:
    a cantilever; and
    a probe separate and independent from the cantilever and integrally connected to an end portion of the cantilever for scratch-processing a defective portion of a sample, the cantilever and the probe being conductive for preventing the generation of electrostatic charges by friction of the probe against the sample during scratch-processing of the defective portion of the sample.

10. A processing probe according to claim 9;
    wherein the cantilever comprises an anisotropically-etched silicon cantilever.

11. A processing probe according to claim 9;
    further comprising a conductive element injected into the cantilever and the conductive probe for making the cantilever and the probe conductive.

12. A processing probe according to claim 9;
    further comprising a metal coating disposed on the cantilever and the probe for making the cantilever and the probe conductive.

13. A processing probe according to claim 9;
    wherein the cantilever comprises an anisotropically-etched silicon cantilever coated with a conductive film.

14. A processing probe according to claim 9;
    wherein the cantilever comprises a thin metal film.

15. A processing probe according to claim 9;
    wherein the cantilever comprises an anisotropically-etched silicon cantilever and the conductive probe is formed on the end of the silicon cantilever by a focused ion beam deposition technique; and further comprising a conductive film coated on the silicon cantilever and the conductive probe.

16. A processing probe according to claim 15;
    wherein the conductive probe is in the shape of a cylinder.

17. A processing probe according to claim 15;
    wherein the conductive probe is in the shape of a square pillar.

* * * * *